Dec. 12, 1961 H. A. KOHLER 3,013,188

MECHANICALLY INTEGRATED CIRCUIT BOARD AND A METHOD OF MAKING SAME BY DIE FORMS

Filed Jan. 16, 1958 5 Sheets-Sheet 1

INVENTOR.
HARRY A. KOHLER
BY
Eugene S. Lovette

Dec. 12, 1961 H. A. KOHLER 3,013,188

MECHANICALLY INTEGRATED CIRCUIT BOARD AND A METHOD OF MAKING SAME BY DIE FORMS

Filed Jan. 16, 1958 5 Sheets-Sheet 2

INVENTOR.
HARRY A. KOHLER
BY
Eugene S. Lovette

INVENTOR.
HARRY A. KOHLER
BY
Eugene S. Louette

INVENTOR.
HARRY A. KOHLER
BY
Eugene S. Lovette

Dec. 12, 1961 H. A. KOHLER 3,013,188

MECHANICALLY INTEGRATED CIRCUIT BOARD AND
A METHOD OF MAKING SAME BY DIE FORMS

Filed Jan. 16, 1958 5 Sheets-Sheet 5

INVENTOR.
HARRY A. KOHLER
BY
Eugene S. Lovette 3,013,188
Patented Dec. 12, 1961

3,013,188

MECHANICALLY INTEGRATED CIRCUIT BOARD AND A METHOD OF MAKING SAME BY DIE FORMS

Harry A. Kohler, 205 Commonwealth Ave., Massapequa, N.Y.
Filed Jan. 16, 1958, Ser. No. 709,272
10 Claims. (Cl. 317—101)

My invention relates to an improved mechanically integrated circuit structure and a method of making same, and in particular, to an efficient and reliable method and structure for producing electrical circuit paths and terminations from sheet metal formed into strips, which strips are equally adaptable for simple or intricate circuit patterns wherein the formed strips may be bonded or otherwise secured to an insulating supporting base and which permits electrical components and hardware to be assembled or fastened thereto such that the method and apparatus can be easily adapted to modern automatic production techniques.

The invention is intended to surmount the limitations of the present and widely used methods of manually installed and connected wiring of electrical and electronic apparatus, but more particularly it is intended to avoid the problems and difficulties inherent in the use of so-called "printed circuitry" as currently practiced.

Printed circuits techniques now in use fall into many categories of which the following are the best known: (*a*) etched circuits, wherein the circuit pattern is printed with an acid resistant ink on conducting material, such as metal foil, which foil is bonded to an insulator base. The circuit board is then submerged in acid which etches away the uncovered areas and thus the unwanted area of metal foil; (*b*) plated circuits, wherein the circuit pattern is printed with a conductive metallic ink on an insulator board and then "plated up" with copper or silver, or as an alternative, a circuit pattern may be plated up on a "carrier" which then transfers the plated pattern to an insulator board; (*c*) painted wiring, wherein a desired circuit is printed on an insulator base with graphite or metal powder; (*d*) sprayed and powdered wiring, wherein molten metal is spread into grooves or powdered metal is sintered into grooves wherein the grooves are preformed to take on the shape of a desired circuit pattern; and (*e*) embossed or stamped wiring, wherein a circuit pattern is stamped or embossed directly into a deformable or flowable insulator base meter.

Each of the foregoing printed circuit techniques possesses certain advantages over the other techniques. Consequently, the choice of one technique over the other is normally dictated by the conditions in which the circuit will be employed. For example, the painted wiring technique is generally limited to low current applications of simple circuit patterns and is sometimes used to produce resistors and capacitors. The stamped and embossed wiring techniques are commonly used in special applications of small size such as switch and commutator patterns, loop antennas wherein an insulator base can be limited to deformable material. Spray metal and metal powder conductor printed circuits are comparatively expensive and thus are used mostly in special applications. However, all these techniques are subject to certain basic disadvantages and undesirable limitations. Etched circuitry is at present most widely used because of its relative simplicity and it best provides relatively low cost production, consequently the limitations of this technique now will be noted in some detail. Etched circuitry is subject to latent acid and chemical contamination caused by the trapped etching agents introduced during the etching process. The thin foil conductors, which are secured to the insulator base break loose due to the application of heat necessary in making dipped solder connection of components to the assemblage. Unfortunately, these conditions usually are not apparent during inspection or testing of the assembled printed circuit, and as often is the case, failure of the circuit may occur at any time during actual use particularly where the apparatus is subject to vibration. The thinness and consequently low strength of the conductor foil necessarily used in this type of circuit is also the cause of breakdown occurring from unequal expansion and contraction of the insulator and attached conductor material when the assemblage is subjected to unusual temperature variations. Moreover, it has been noted that current overloads will often cause similar failures. Another problem peculiar to the printed circuits of current use results from the fact that the close proximity of bare conductor or component elements results in bridging by solder at connections of the components upon dip soldering same.

Plated circuits are also subject to most of the aforesaid limitations. The conductors thereof have a relatively weak adhesive bond to the insulator base. Usually one must resort to supplementing bonding by "eyeleting" or "plating through" holes to provide additional securing means. The foregoing problems necessitate expensive inspection and correction measures during manufacture of printed circuits to assure mechanically satisfactory structures. Moreover, it is noted by way of comment, that in the production of the printed circuits, considerable expense is required in the investment of capital equipment such as electrolytic and acid tanks, filters, baths and waste disposal apparatus which must be suitably coordinated with testing apparatus and procedures for the purpose of maintaining and controlling quality of circuit production.

It is the principal object of the instant invention to produce an improved mechanically integrated circuit made up of preformed strips of sheet metal conductor cut or otherwise formed to desired shape which can be readily shaped to satisfy simple or intricate circuit patterns and which strips are bonded or molded to an insulating supporting base to which circuit components such as resistors, coils, capacitors, tubes, etc., can be easily applied.

It is a further principal object of the instant invention to provide an improved method for fabricating the aforementioned mechanically integrated circuit. The process contemplates shearing, cutting or otherwise forming conducting material in proper spaced relationship as strips so as to provide the desired circuit pattern whether such pattern be simple or complicated in nature and then to apply such strips in the designated spaced relationship to an insulated base. Terminals are embossed at desirable places or points along the strips of conducting material. The embossed terminals project above the plane of the conducting strips whereby they are readily accessible to receive connections with circuit components to be soldered thereat without interfering with the remainder of the conducting strip portion of the printed circuit. The conducting strips except for the embossed terminal portions thereof may be coated with an insulation. However, the embossed terminals remain exposed to enable dip soldering of circuit components to take place at the terminal areas only.

It is a further object of the instant invention to provide improved mechanically integrated circuit structure and the method of making same which is adaptable to the various uses now satisfied by printed circuits and permits the use of any one or more of the various types of conducting materials as determined solely by the application to which circuit will be put and similarly permits the use of any one or more the various types of insulation materials for the insulator bases, also depending solely upon the circumstances in which the structure is to be employed, and likewise permits the use of any one or more of the various bonding agents for the purpose of attaching and holding the conductor paths to the insulator base. The improved structure and method therefor is not confined to a particular metal for conductor strip, a particular material for the base or a particular bonding agent but allows one the choice of any desirable variation of materials to satisfy optimum electrical and mechanical characteristics.

It is a further object of the instant invention to provide simplified means for piercing terminal holes on printed circuit structure for splicing component leads thereto.

It is a further object of the instant invention to provide a mechanically integrated circuit which is capable of accommodating heavy currents and which is substantially vibration-proof and which desirably resists temperature, moisture, oxidation and other environmental effects.

It is a further object of the instant invention to provide a mechanically integrated circuit structure and an improved method of fabricating same wherein circuit elements such as resistors, capacitors, switch contacts and other components are integrally assembled to the circuit structure notwithstanding the fact that said components and circuit conductors may be made of dissimilar metals, and wherein said components may be simultaneously secured to the printed circuit conductor paths, and which provides novel means for inserting and soldering connecting components such as switch contacts, bushings, terminal posts, conductor standoffs, jack plugs and sockets of the various types.

It is a further object of the instant invention to provide mechanically integrated circuit structure and a method of making same which lends itself effectively to complex as well as simple circuit patterns either of small or large size wherein the conductor paths are formed from sheet metal conductor material of width and thickness dimensions as determined by the requirements of the particular circuit.

It is a further object of the instant invention to provide improved mechanically integrated circuit apparatus which provides improved economy of fabrication and large savings in soldering materials since by nature of the circuit only terminations thereof are adapted to take solder and wherein substantially 100% salvage of scrap conductor material is realized which has special significance when noble metals, such as silver and gold, are used for conductor material.

It is a further object of the instant invention to provide improved mechanically integrated circuits which avoids the aforesaid limitations of printed circuits currently in use, such as circuit failures caused by acid or electrolytic contamination of conductors and insulating material, circuit failures caused by breakdown of insulator-conductor bond as a result of the presence of heat brought about by dip soldering and circuit failures caused by breakdown by reason of fragile conductor foils due to unequal expansion and contractions of insulator and conducting materials.

It is a further object of the instant invention to provide a practical method of stacking circuit paths and to provide improved means of making insulating and connecting circuit crossovers.

Further objects and advantages will become apparent from the following description of the invention taken in conjunction with the figures, in which.

Figures 1, 22, 23, 24, 25, 26:
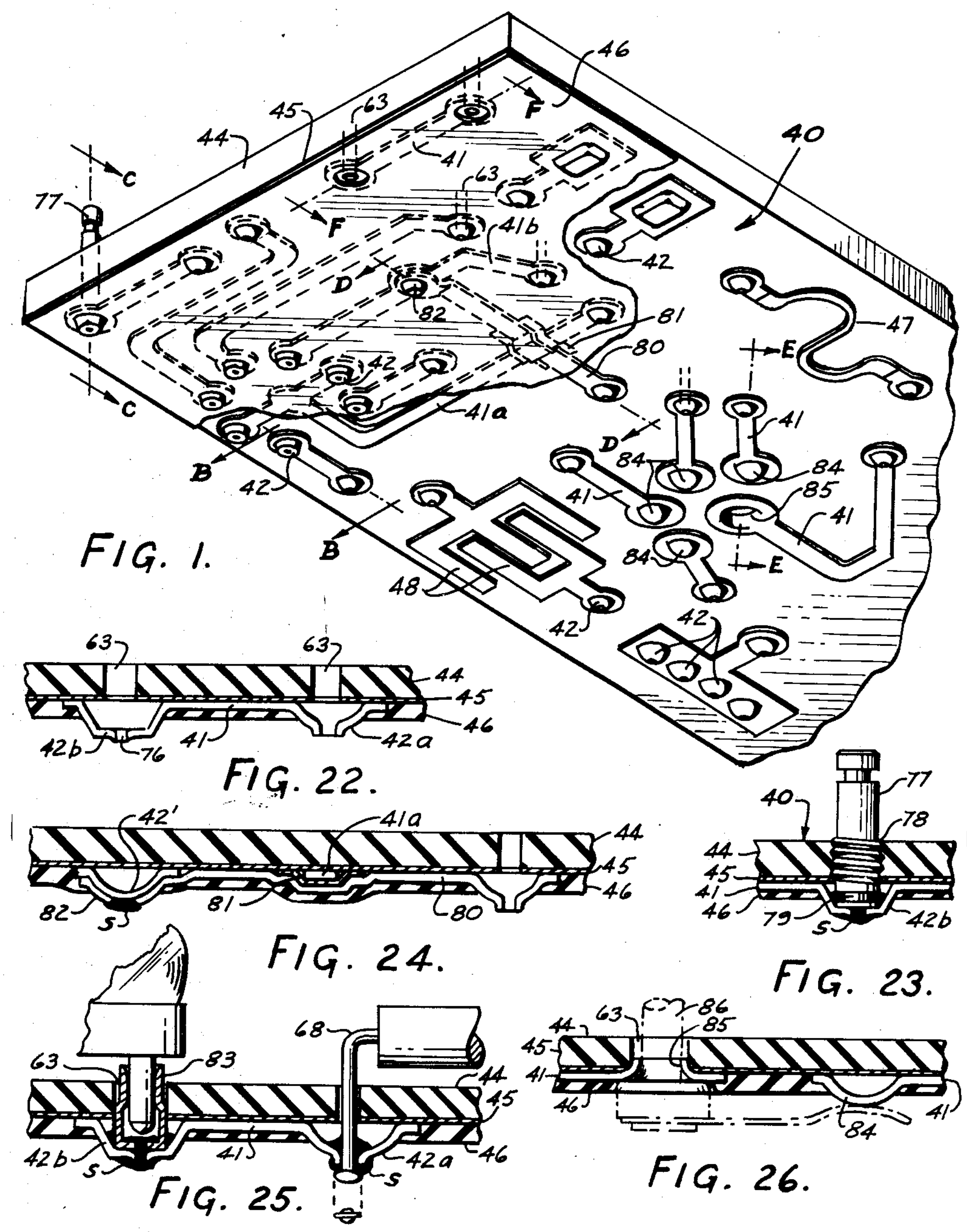
FIG. 1 is a fragmentary perspective view of a circuit board incorporating a mechanically integrated circuit in accordance with the practice of the instant invention wherein the insulating coating extending across the conductor side of the board is partly cut away for the purpose of obtaining a clearer view of the circuit conductors.
Figure 27:
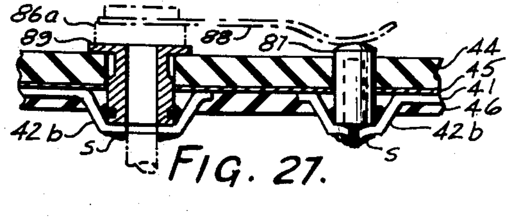
Figures 33A, 33B:
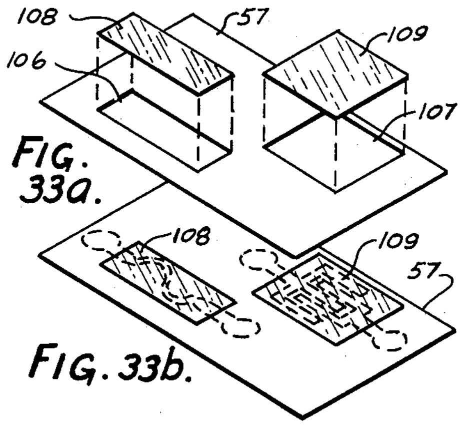
Figure 9:
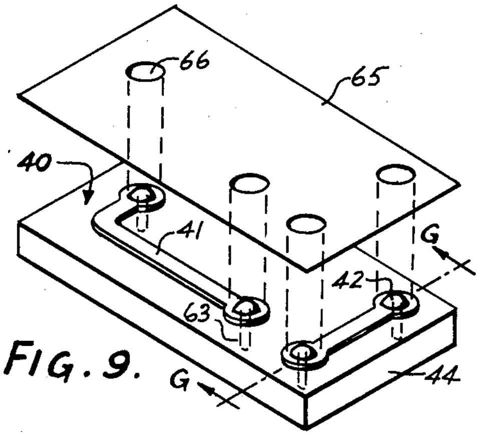
FIG. 9 is an exploded and perspective view of a circuit board shown with a simplified circuit pattern which figure is used to illustrate further the practice of the instant invention.
Figure 10:
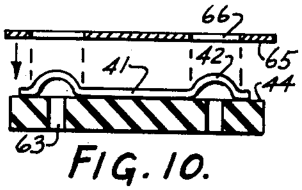
Figure 11:
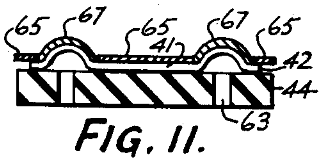
Figure 13:
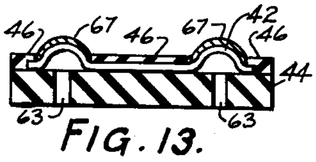
Figure 14:
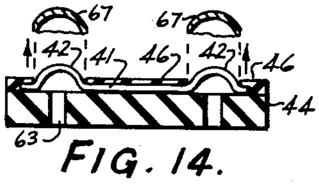
Figure 15:
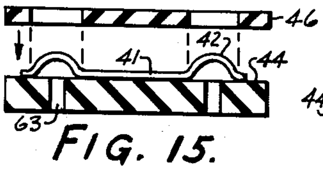
Figure 16:
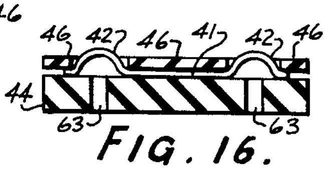
Figure 17:
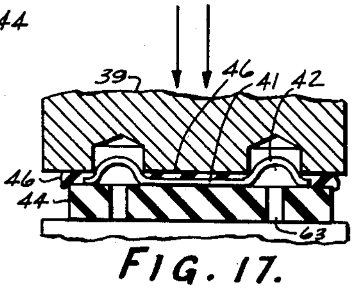
Figures 28, 29, 30, 31, 32, 34, 35, 36, 37, 38, 39, 40:
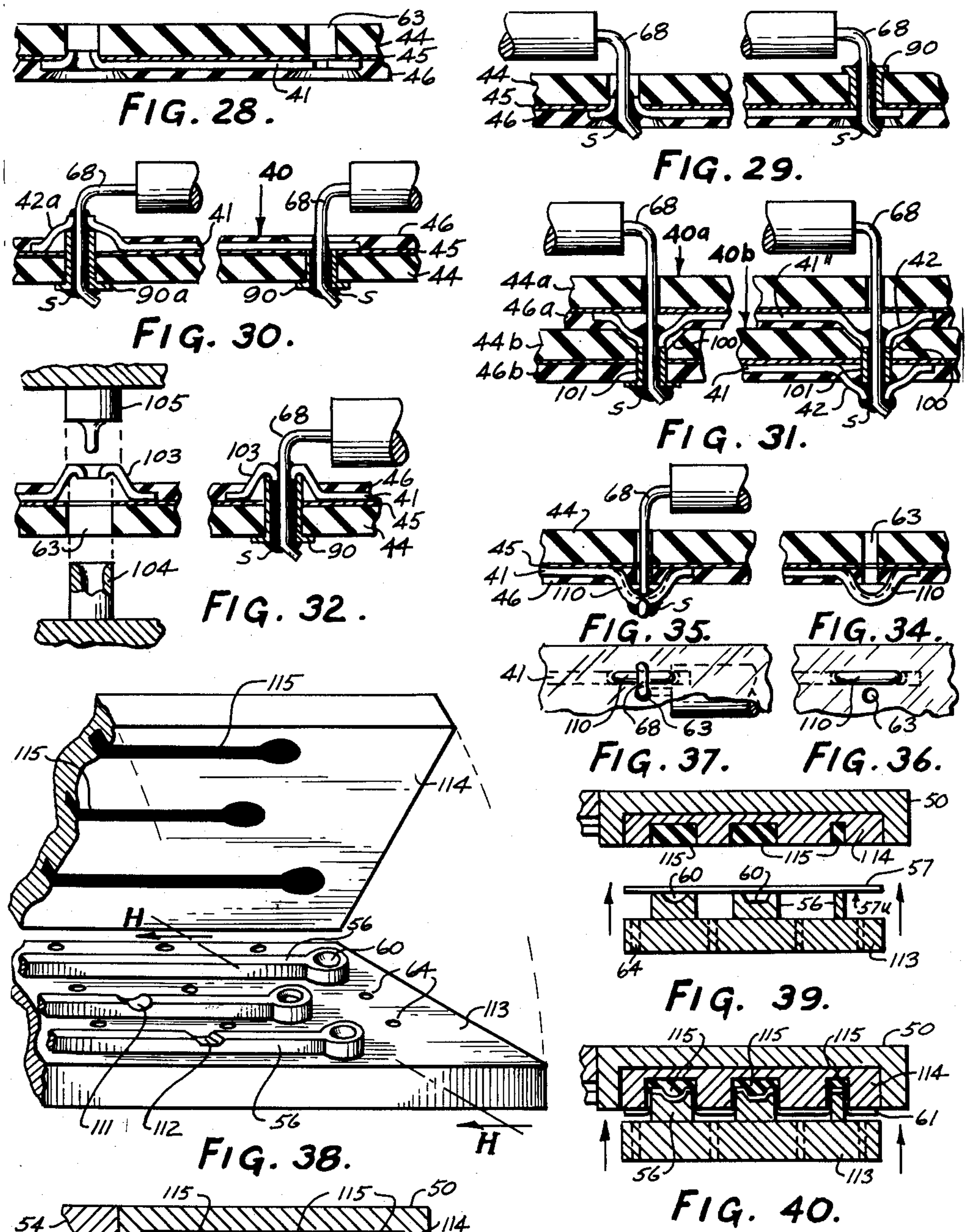
Figure 41:
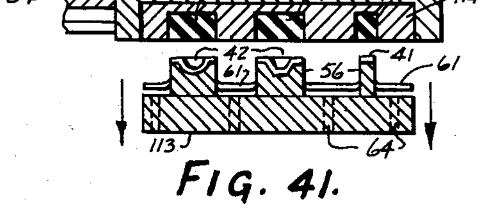

FIGS. 10 through 14 are sectional views of the circuit board taken along line G—G of FIG. 9 and illustrate a further sequence of operations in accordance with the practice of the instant invention; whereas, FIGS. 15 through 17 also show the circuit board taken along line G—G of FIG. 9 but now show an alternative sequence of operations that may be employed in lieu of the arrangement shown in FIGS. 10 through 14;

FIGS. 18 through 21 again show sectional views of the circuit board taken along line G—G of FIG. 9 and illustrate the concluding sequence of events in accordance with the practice of the instant invention;

FIGS. 22 through 30 illustrate various circuit and hardware components that are applicable to a circuit board made in accordance with the practice of the instant invention; wherein, FIG. 22 is a fragmentary and sectional view taken along line B—B of FIG. 1; wherein, FIG. 23 is a fragmentary section taken along line C—C of FIG. 1; wherein, FIG. 24 is a fragmentary and sectional view taken along line D—D of FIG. 1; wherein, FIG. 26 is a fragmentary and sectional view taken along line E—E of FIG. 1 and FIG. 28 is a fragmentary and sectional view taken along line F—F of FIG. 1;

FIG. 31 is a fragmentary and sectional view of a plurality of circuit boards illustrating the practice of the invention wherein the formed circuits are stacked;

FIG. 32 illustrates in a fragmentary and sectional view a terminal embossing and tools for forming same wherein the illustrated embodiment of the conductor terminal embossing is different in design than the terminals shown in the earlier numbered figures;

FIGS. 33*a* and *b* are perspective exploded views of a conductor sheet of a first material showing the method of replacing sections thereof with conductor sections of material for the purpose of forming electrical components such as condensers and resistors;

FIGS. 34 and 35 show fragmentary and sectional views of still another terminal embossing embodiment; whereas, FIGS. 36 and 37 are fragmentary planar views of FIGS. 34 and 35 looking up at the terminals; and FIGS. 38 through 41 illustrate an alternate tool or die apparatus for cutting and forming the circuit board; wherein, FIG. 38 is a fragmentary perspective view of the tool and FIGS. 39, 40 and 41 are fragmentary sectional views taken along line H—H of FIG. 38 and show the sequence of operation employing the press illustrated in FIG. 38.

Reference is now made to the figures and in particular to FIG. 1 which shows apparatus employing a formed and applied mechanically integrated circuit board 40 for the purpose of illustrating the principles of the invention. A plurality of conductor strips 41 of various shapes and configurations, their respective terminal embossings 42 and various circuit components and hardware are secured to a base or board 44 of electrical insulating material by a suitable bonding medium 45. Conductor strips 41, terminal embossings 42 and certain of the circuit components were cut, formed and laid out in spaced relationship in accordance with a predetermined circuit pattern. The formed pattern was then applied and bonded to insulating base 44. Strips 41 and certain of the circuit components are also shown covered by a coating of insulating material 46 which may be optional with the system. The formed circuit components, such as, resistor 47 and condenser 48 were cut, formed and applied simultaneously with conductor strips 41 and terminal embossings 42. However, it will be understood that these circuit components may be made from different types of metals such as nichrome and gold which were preinserted in a sheet or foil of conductive material 57 in a manner to be described hereinafter.

Figure 2:
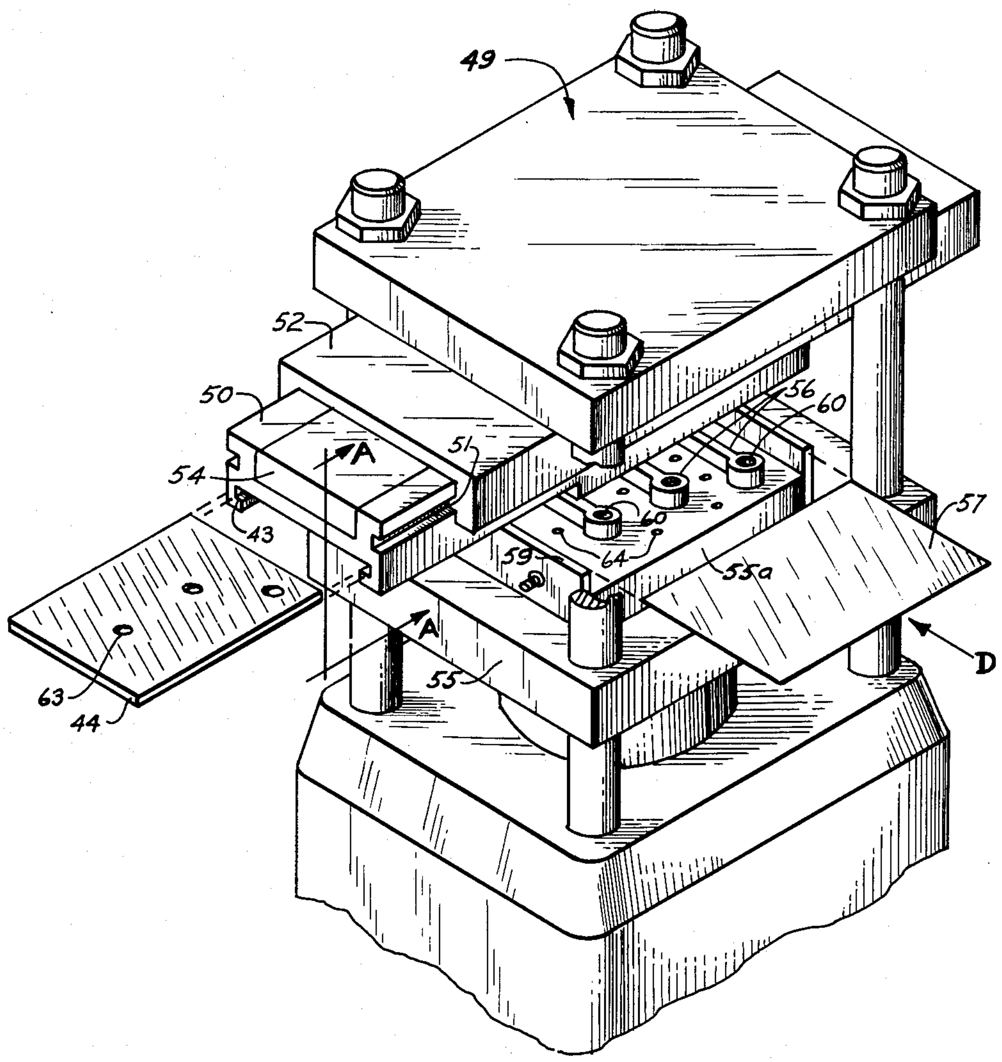
FIG. 2 is a fragmentary perspective view of a die press employed in the practice of the instant invention.

FIG. 2 depicts a hydraulic press 49 arranged for die cutting and forming the ribbon shaped conductor strips and other circuit elements pursuant to a desired circuit pattern and also serves to apply the cut and formed conductors and components, as disposed in their respective positions, to insulator base 44. A two-station indexing shuttle 50 is mounted for translation in a rail 51 in a top plate 52 of press 49. Shuttle 50 may be operated manually, hydraulically or pneumatically. Shuttle 50 contains a striking pad 53 (seen best in FIGS. 14 through 16) in one shuttle station and contains a unitary holder member 54 which embodies an electrical or steam heating unit in the other shuttle station. The lefthand station also includes a rail 43 to accommodate insulation base 44 upon insertion of same in the shuttle station. A lower platen 55 is mounted on a vertically moving ram and carries a male die 55*a* provided with a hardened steel pattern 56 of predetermined shape and form pursuant to the desired circuit. The sharp edges of die pattern 56 will shear conductor strips 41 from a blank sheet of conducting material 57, the thickness of which will be determined by the desired thickness of the conductor paths to be formed therefrom. The cavities 60 in die pattern 56 serve to form the terminal embossings 42.

FIGS. 3 through 8 show sections of press 49 taken through the plane A—A and facing in the direction D of FIG. 2. These figures depict successive stages of shearing and forming the conductor circuit paths from a blank sheet of conductor foil 57 and also illustrate the steps of securing the strips and components formed by the cutting process to insulator board 44. The figures will now be described individually.

Figures 3, 4, 5, 6, 7, 8:
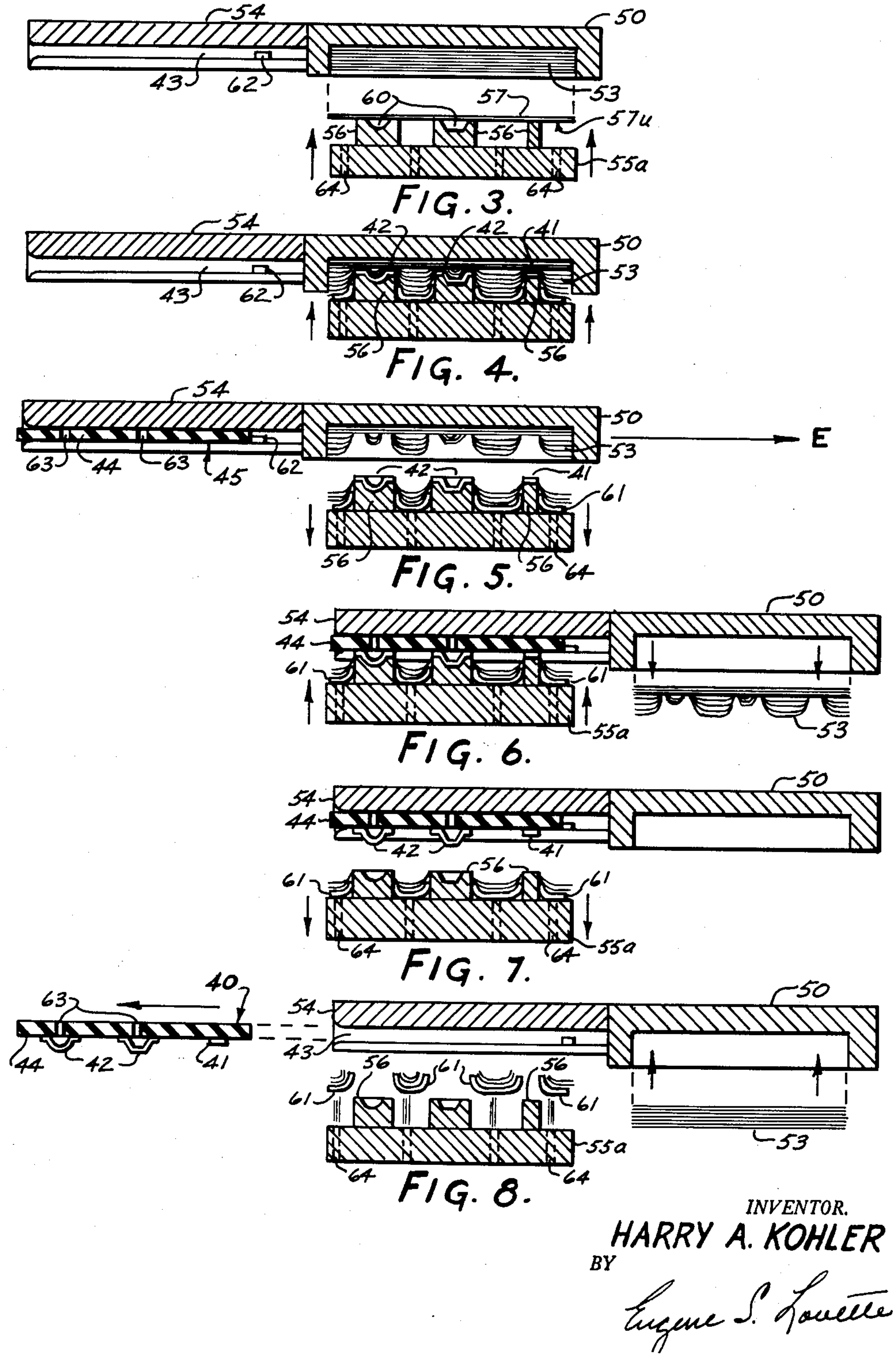
FIGS. 3 through 8 are sectional views taken along line A—A in the direction of D of FIG. 2 and illustrate the sequence of operations upon employing the press shown in FIG. 2 for the purpose illustrating the practice of the instant invention.

FIG. 3 depicts shuttle 50 in its first position, wherein the righthand station is juxtaposed lower platen die 55*a*. Blank sheet of conductor material 57 is loaded in press 49 by insertion of same on cutting die members 56 between guides 59. The underside 57*u* of conductor sheet 57 previously has been spread with a very thin film of cold tack adhesive, such as a solution of rosin and beeswax thinned out with alcohol. This cold adhesive will keep the cut and formed conductor strips and components in position on their respective members of die pattern 56 after foil 57 is sheared and formed. A laminated compressible striking pad 53 consisting of an appropriate quantity of thin sheets of paper or fibrous material, which may be spot glued around the edges thereof to keep the sheets from separating, is embedded in the righthand shuttle station. The press ram is now upwardly actuated, carrying die 56 and conductor sheet 57 into striking pad 53, as shown in FIG. 4. This figure depicts the apparatus at the top of the stroke and shows die 56 embedded in striking pad 53. At this point, strips 41 and the other components are sheared and terminals 42 are embossed due to the compressibility and flow of the striking pad lamina 53.

FIG. 5 shows the lower platen 55 undergoing its downward stroke upon withdrawal from striking pad 53. The formed conductors 41 are shown resting on top of die pattern 56 of the downwardly moving ram and are ready for transfer to insulating board 44. Scrap conductor material 61 and some of the striking pad lamina remain wedged between die pattern members 56. Insulator base 44 is loaded into holder rail 43 of the left-hand index station until it abuts against stop 62. Insulator base 44 is provided with suitably drilled or punched holes 63, which holes may be tapped, tapered or otherwise already pretreated so as to be operatively associated, that is to say, alined with respective ones of terminals 42. Base 44 also contains a coating of curable resin adhesive 45 on its underside. Since certain of said holes 63 have been suitably prepared to cooperate with respective ones of said terminals 42, the location of individual ones of holes 63 in insulator base 44 are predetermined to line up with the correlated conductor terminals 42 after shuttle 50 is moved in the direction of E whereby the mounted insulator base 44 is positioned juxtaposed die pattern 56. Ram is again actuated upwardly to carry the formed conductors 41 against insulator base 44 as shown in FIG. 6 and held in this position long enough for curing of adhesive 45. The heat for curing bonding material 45 is furnished by heating unit 54 in upper platen 52.

The applied heat also causes the cold tack adhesive film on the underside of the cut and formed conductors 41, which initially served to hold the cut conductors 41 to die members 56, to melt and release as conductors 41 are being firmly bonded to base 44. Since the righthand shuttle station is now exposed, the used striking pad 53 may be replaced by a new one. FIG. 7 shows lower platen 55 at the bottom of its stroke after withdrawal from upper platen 52 upon completion of bonding cut conductors 41 and other formed components to board 44. FIG. 8 depicts removal of insulator base 44 with the cut and formed conductors 41 firmly bonded thereto and also depicts the application of compressed air through suitable conduits 64 in order to remove the scrap material wedged between die members 56.

Certain variations to the above-described method may be employed which will depend upon the insulator base material used. For example, when rubber is used for base 44, both upper and lower platens 52, 55 normally would be electrically or steam heated for vulcanizing conductors 41 thereto, or conversely, none of the platens need be heated when certain types of pressure-sensitive adhesive materials are used on insulating base 44 to which the conductor patterns 41 are bonded.

The conductor board 40, as shown in FIG. 8, is now ready to receive an overlayer of insulating material 46 for the purpose of coating the exposed conductor strips 41 and other elements or components carried by base 44. The addition of conductor coating 46 is optional and its use will depend upon the conditions specified by the circuit in which the conductor board 40 is to be used.

Figure 12:
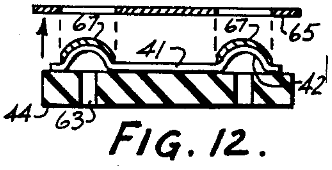

FIGS. 9 through 14 illustrate the preparation made to conductor board 40 in order to apply the additional insulating coating 46 and for the purpose of this discussion, the conductor board 40 shown in FIG. 9 has been deliberately simplified. A mask 65 is provided with pierced holes 66 and is fitted over the conductor side of base 44. Holes 66 are disposed in mask to aline over terminal embossings 42 which project therethrough. The protruding terminal embossings 42 are now covered by a suitable stopoff such as wax material 67 which may be sprayed thereon. Mask 65 is now removed as depicted in FIG. 12; it served merely to prevent spraying of stopoff material 67 on the portions of conductor 41 to be coated with insulating material 46. Insulating covering 46 may now be applied to all the exposed conductors 41. A curable resin, varnish, or paint, etc., may be either air, bake dried or cured to the exposed conductors 41 as depicted in FIG. 13. Stopoff material 67 is then removed as shown in FIG. 14 and this may be done by wire brushing, etching by a suitable solvent which will not affect coating 46 previously applied. As an alternative, coating 46 may be applied in any suitable manner to the exposed conductors 41 as shown in FIG. 13 and then partially air cured and subsequently baked at a high temperature. The volatiles in the stopoff material 67 will cause same to strip off terminal embossings 42 during such baking.

FIGS. 15 through 17 show an alternative method for applying coating 46 to conductors 41 wherein FIG. 15 shows the application of a partially cured resinous adhesive sheet 46 with die cut holes preset to aline with terminal embossings 42. FIG. 16 shows sheet 46 resting on conductor side of base 44 with terminals 42 protruding from the holes in sheet 46; FIG. 17 shows coating 46 being pressed on the conductors 41 and cured in this position by a heated press platen 39. The pressed die is relieved at the points where it would otherwise engage and crush terminal embossings 42.

Figures 18, 19:
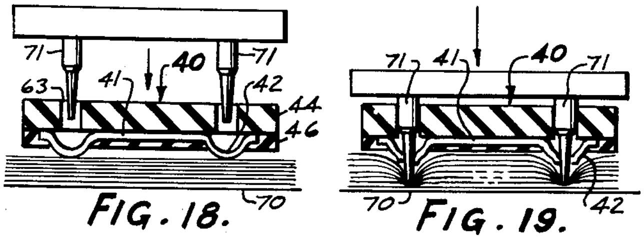
Figure 20:
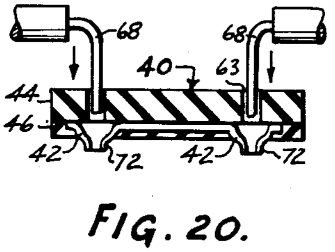

FIGS. 18 and 19 depict the step next to follow and involves the process of piercing holes in terminal embossings 42 or otherwise die treating said terminals in order to receive terminal leads 68, 68 of the various electrical components or other hardware to be attached to board 40. In this instance, circuit board 40 is now placed in a power press with the terminal embossings 42 resting upon a laminated pad 70 similar to the pad shown hereinbefore. A die provided with all the required piercing punches 71 predeterminately alined with the various individual terminal embossings 42 to be pierced is rammed downwardly to cut holes through the individual terminal embossings 42. During this operation, outwardly depending flares 72 are formed around the pierced terminal holes which flares 72 provide side contacts for the individual terminal leads 68 to be fitted therethrough. Thereafter, all electrical components and other hardware elements such as resistors, condensers, coils, switches, jacks, posts, etc., to be attached to the circuit board 40 are inserted in the respective terminal embossings 42 provided therefor. FIG. 20 shows two resistors having terminal legs 68 extending through respective ones of terminal embossings 42. The ends of the terminal legs of each of the mounted electrical components are preferably pinched or otherwise flattened to form flares 74 as shown in FIG. 21 to hold the components to board 40 and to facilitate soldering.

Figure 21:
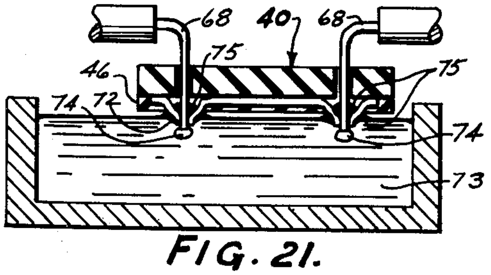

Circuit board 40 is then held substantially horizontal and lowered into a dip solder bath 73 as depicted in FIG. 21. It will be noted that the surface of insulating coating 46 need not come in contact with the molten solder 73. Circuit board 40 need only be immersed in solder bath 73 far enough to engage the depending terminal leads 68 and the depending exposed bottoms of terminals 42 to be soldered. Capillary action will allow the solder to flow up and around terminal leads 68 and into the terminal embossings so as to solidify at 75. Should board 40 be immersed in bath 73 further than the amount of immersion depicted in FIG. 21, the quantity of solder used will still be substantially the same because the solder normally will not adhere to the insulated cover 46 along the underside of board 40 but will be confined to terminal portions 42 which are exposed to receive the solder. In order to simplify the drawings, the reference S will be used in the figures to depict the soldered joints.

FIG. 22 is a section taken along line B—B of FIG. 1 and serves to illustrate the fact that terminal embossings 42 may have various shapes and contours. This figure shows two types of raised terminations; the righthand terminal 42*a* has been described hereinbefore; the lefthand terminal 42*b* is also raised and was formed by a suitably shaped cavity 60 of die member 56. The hole 76 in terminal 42*b* (pierced during the operation depicted in FIGS. 18 and 19) is relatively small, merely large enough to allow the flow of solder therethrough, hence substantially no flare exists at this terminal.

FIG. 23 is a section along line C—C of FIG. 1 and shows a standoff terminal post 77 attached to circuit board 40. Standoff post 77 is provided with a threaded portion at 78 and was threadedly secured to board 40 at the time when the other components were dropped into their respective terminals prior to dip soldering. The tapped hole to receive threads 78 was initially provided in the blank base 44 and was one of the many holes 63 prepared in base 44. The lower end of standoff post 77 is provided with an undercut 79. Upon immersion of the board 40 in solder bath 73, solder flows through hole 76 in terminal 42*b* and around undercut 79 to bond post 77 to board 40.

FIG. 24 is a section along line D—D of FIG. 1 and illustrates the details of a crossover conductor 80 separated from lower tier conductor strip 41*a* by an insulator strip 81. Lower tier conductor 41*a* and the lefthand terminal 42′ (this terminal as seen in FIG. 1 is an integral part of another lower tier strip 41*b*) were formed and applied to base 44 in the manner described hereinbefore. Terminal 42′ is not pierced because in this instance no terminal lead or other component is extended therethrough. However, the lefthand terminal 82 of outer conductor strip 80 is pierced to permit the flow of solder between the contiguous concave-convex surfaces for bonding the mating terminals 42′ and 82. The crossover conductor 80 is formed and applied in a separate and distinct operation which requires again reference to FIGS. 3 through 8. After the first plane of conductors, including strips 41*a*, 41*b* have been formed, die 56 is replaced by a second die which has a single die cutting member of one strip to form conductor strip 80 and its two terminals. Consequently, at the righthand side, the die pattern will have a depression or cavity to form the righthand terminal and at its lefthand side another depression or cavity to form lefthand terminal 82 which is to fit over the convex face of terminal 42′. Between the two and in the region where outer conductor 80 is to bridge over the lower tier conductor 41*a*, the die member will be suitably depressed to form the bridge. A second blank of conductor foil is mounted over the die member as indicated in FIG. 3 and is then cut and formed as indicated in FIG. 4. When the lower platen is lowered, insulating strip 81 is placed over the bridge formed in the cut strip 80 and then circuit board 40 with its first plane of conductors facing downwardly thereon is shuttled juxtaposed the second die member which is again raised until it abuts against circuit board 40. The side of strip 80 to be pressed against circuit board 40 except in the cavity region of terminal 82 may be suitably coated with an adhesive bond so that strip 80 can be secured to board 40. As an alternative, circuit board 40 may be masked with openings wherein the exposed area is coated with some adhesive which will serve to secure strip 80 thereto. Additional securing will be obtained by the overall coating 46 which will be later applied to circuit board 40 and by soldering of the lefthand terminals as shown in FIG. 24.

FIGS. 25 through 32 illustrate the application of various types of hardware such as switches and terminal connections and other circuit variations that may be accommodated by the practice of the instant invention.

FIG. 25 shows one terminal leg 68 of an electrical element soldered to a terminal embossing as noted hereinbefore. A cylindrical tube or jack prong socket 83 is shown secured in the lefthand side of the illustration. Jack prong socket 83 was inserted in the opening 63 provided in base 44 at the time the other components were individually mounted to circuit board 40, and is soldered to terminal 42*b* during the dip soldering process described hereinbefore. Solder S will flow into the bottom of socket 83 through alined openings, one of which is an opening pierced in terminal 42*b* whereas the other is provided in prong socket 83. To increase the bond of socket 83 to terminal 42*b* the bottom outer surface of socket 83 may be initially tinned or coated with solder.

FIG. 26 is a section taken along line E—E of FIG. 1 and shows one of a plurality of raised switch contacts 84 which are substantially rounded embossings. The array of terminals 84 may be masked during dip soldering. A receptacle 85 for journalling a switch shaft 86 is extruded into a predrilled hole 63 in insulator base 44 and was suitably masked during the application of coating 46 and dip soldering. After circuit board 40 is soldered, switch shaft 86 is fitted into its journal 85 and is provided at its upper end with a handle, not shown herein, which will permit turning of switch 86 so that connection can be made to any one of the plurality of terminals 84 shown in FIG. 1.

FIG. 27 shows a modified switch 86a to accommodate the requirement of having contact points 87 projecting from the non-conductor side of circuit board 40. The contact terminals are slugs 87 dropped in respective ones of predrilled base holes 63 and soldered to correlated terminal embossings 42b. The upper ends of slugs 87 protrude above the plane of board 40 to permit conductive contact with switch contact arm 88. Switch 86a is journaled in a bushing 89 soldered to a respective terminal embossing. Switch 86 is inserted in its bushing 89 after the soldering process so that it is free to rotate.

FIG. 28 is a longitudinal view taken along line F—F of FIG. 1 and shows a conductor strip 41 having flat terminals wherein the lefthand terminal is formed by piercing conductor 41 and extruding it into a correlated predrilled hole 63 and its righthand terminal formed by drilling strip 41. The righthand terminal of this unit is shown in FIG. 29 with an eyelet 90 to receive a terminal leg 68 of an electrical component. The inner bore of eyelet is preferably solder tinned and eyelet 90 acts as a capillary tube during the dip soldering process. Insulating coating 46 in the vicinity of the terminal areas has been masked away and the ends of the component connection leads 68 projecting through the terminals are bent over to provide a stronger connection.

Hereinbefore the various attachable circuit components such as condensers and resistors were shown mounted along the non-conductor side of circuit board 40. However, the invention is not limited to this arrangement. The invention also contemplates attaching all the attachable components from the other side of circuit board 40, that is to say, the conductor side, as shown in FIG. 30, wherein flat terminal in one instance and an embossed terminal in the other are shown employed for connection with the attachable circuit components. Eyelets 90 provided with solder tinned bores are mounted in their respective holes 63 in the insulator 44. Solder connection S is made by dip soldering process as described hereinbefore except in this instance the non-conductor side of board 40 is dipped into solder bath 73. Solder S will run up eyelets 90 and around component leads 68 by reason of capillary action to complete the joint. No solder will adhere to the insulator face. The lefthand terminal also serves to illustrate an axially long eyelet 90a.

FIG. 31 illustrates another modified embodiment which may be accommodated by the practice of the instant invention. The figure depicts sections of two circuit boards 40a, b stacked or tiered with the conductor paths 41" of upper tier board 40a sandwiched between the tiered insulator bases 44a, b. Stacking of boards 40a, b may be accomplished by countersinking the lower insulator base 44b at 100 to accommodate recessing of the convex surfaces of the terminal embossings 42 of upper board 40a and applying bonding adhesive to the countersunk regions 100 of lower insulator base 44b. It will be understood that the individual circuit boards 40a, b were made separately and then mechanically fitted together. Thereafter, solder-tinned capillary tubes 101 were inserted in correlated holes 63 of lower tier circuit board 40b. The two boards may be permanently secured together by mechanical means, such as screw bolts or by bonding lower tier board 40b to coating 46a of upper circuit 40a under pressure. Thereafter, the electrical components are inserted in their respective places and are shown herein mounted from the non-conductor side of the upper tier board 40a. The completion of the circuit requires dip soldering of the various components to their respective terminals wherein the solder runs up tinned tubes 101 to make inner terminal connections by capillary action.

FIG. 32 is a section through a circuit 40 which shows terminal structure 103 designed with inward flared sides made by flaring tools. The flaring tools may be part of the punching die described hereinbefore re FIGS. 18 and 19 wherein an added lower platen includes a female die member 104 and the upper platen includes a male die member 105. The righthand portion of FIG. 32 shows a terminal lead 68 soldered to terminal 103.

It was noted hereinafter that the conductor paths defined by strips 41 may be formed to produce a condenser as shown at 48, a resistor as shown at 47, or other circuit components. Since the material of these components need not necessarily be the same as that constituting the remainder of the current paths, foil 57 has to be prepared to include sections of material of which the condenser and resistor will be made and this is done by reference to FIG. 33a wherein foil 57 is shown with two blanked out regions 106, 107. Blanks of material 108, 109 of which the condenser and the resistor will be made are inserted into the respective openings 106, 107 and brazed to foil 57 as shown in FIG. 33b. The location of blanks 108, 109 in foil 57 are such that they engage the portions or correlated members of the die pattern 56 containing the condenser form and the resistor form, respectively.

FIG. 34 shows another terminal embodiment, in this instance, defined by a loop 110. Loop 110 is an integral part of strip 41 and is formed by a suitable depression 111 as shown in die member 56 of FIG. 38. Terminal 110 has no conductor sides because it is merely a raised bridge. Upon the application of coating 46 except on the raised bridged portion of loop 110, which may be suitably masked during the application of coating 46, a looped area is defined about which terminal leads 68 may be wound or bent over as shown in FIG. 35. For facilitating attachment of an electrical component to terminal 110, it is preferable to have the correlated hole 63 in base 44 offset with respect to the longitudinal axis of strip 41 as shown in FIGS. 36 and 37.

FIGS. 38 through 41 illustrate an alternate tool or die apparatus for cutting and forming conductor path strips 41. In this instance, upper platen 114 serves as the striking pad in lieu of pad 53 shown hereinbefore. Consequently, upper platen 114 is preferably a plate of soft aluminum or a plate of tin lead alloy. Lower platen 113 is provided with die members 56 of suitable and desired shape as noted hereinbefore. However, lower platen 113 may be used to prepare upper platen with suitable recesses 115, ultimately to be filled with a rubber material to serve as the striking pad. To prepare upper platen 114 as the striking pad, recesses 115 must be formed therein to correspond with the overall dimensional projections of the die members 56 in order to receive same when the platens are brought together as shown in FIG. 40. This is done by first preparing lower platen 113 with all the die members 56 in accordance with a desired circuit pattern except that the die members at this time are solid, that is to say, recesses such as 111, 112 and cavities 60 are not yet formed in the die members 56. Recesses 115 are then made in the soft upper platen 114 by urging lower platen 113 against upper platen 114 and thus hobbing recesses 115 by the projecting outlines of die members 56. Thereafter, the various depressions and cavities, such as 111, 112 and 60, may be formed in die members 56 and powdered rubber may be inserted in recesses 115 and then vulcanized. Recess 112 is illustrated to show the type of recess used to form a bridge for a crossover conductor 80 as illustrated hereinbefore in FIG. 24. The platens are now prepared for use in the manner indicated hereinbefore, consequently, lower platen 113 will be inserted on the ram of press 49 and upper platen 114 will be inserted in the suitable station of shuttle 50. FIGS. 39, 40 and 41 correspond in effect to FIGS. 3, 4 and 5 wherein it is seen in FIG. 39 that conductor sheet 57 rests upon die members 56 and is being raised for engagement with the striking pad and wherein FIG. 40 shows shearing and forming of the individual conductors as the individual die members 56 nest in the correlated rubber packed recesses 115 and FIG. 41 shows withdrawal of the lower platen. The rubber in recesses 115 serves to receive, form and cut conductor paths against the correlated juxtaposed die members 56.

One practical advantage of the instant invention is that it will permit the use of practically any conducting metal or combination of conducting metals in constituting foil 57. The choice of metal will depend upon the circumstances to which the circuit will be employed. For example, foil 57 may be made of copper, brass, tin plated metals, silver, gold, aluminum, beryllium copper, Nichrome, magnetic iron, Phosphor bronze. The invention, in addition, will allow any dielectric material to be used for the base 44, the choice of which will depend entirely upon the material used for foil 57 and the circumstances in which the circuit is to be used. The materials for base 44 may include laminates composed of plastics such as phenolic, epoxy, polyester resins, vulcanized fiber, pressed wood fiber, rubber, asbestos, etc. In addition, conductor paths may be set into uncured insulating mold forms and slurries such as Bakelite, ceramics, asbestos, after which curing, firing or baking will form a permanently bonded or embedded conductor insulator circuit board 40. Bonding of the formed conductor paths to base 44 may be accomplished by the commonly used methods and the bonding materials employed are those generally available, the choice of which will depend upon the conductor material and insulator combinations being employed and the electrical, temperature and other environmental characteristics required of the circuit. For example, when circuit forms are to be bonded to phenolic laminates, melamines and silicones, then phenolic or epoxy type resins or cements are commonly used and are either cold or bake cured. With rubber base materials, either rubber cements or vulcanizing may be used. When asbestos or ceramics are used as the base, the conductors may be bonded with porcelain, waterglass or other high temperature cements. Molding the conductor paths into insulating material base may be effected by embedding the formed circuit paths under pressure into uncured Bakelite, ceramic, asbestos slurry, glass epoxy or various plastic compounds, and curing or baking same to make an integral unit.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. A mechanically integrated circuit board for mounting electrical components comprising, a relatively flat supporting base of suitable dielectric material and having opposite faces, said base also having a predetermined pattern of spaced holes extending therein from one face towards the other, a plurality of sectional areas on one face of said board having a coating of adhesive thereon, and an electrical conductor formed of a sheared strip of metal conforming to each of the said areas and secured to said base by said adhesive with the section of adhesive material underlying the electrical conductor strips, the strips and base being so characterized that the strips and base are secured in a fast bond relationship, selected individual ones of said strip conductors being formed of a metal having specific conductive characteristics and cross-sectional areas defining the electrical conductivity thereof, the material constituting each selected strip conductor being individually characterized so that each strip conductor constituting any one of the selected individual strip conductors forms a distinct component, all of said conductor strips being selectively spaced apart to define an array in accordance with a desired circuit pattern, selected ones of said conductor strips having raised portions of uniform cross-sectional thickness defining hollow cavities wherein the segment of the conductor strip constituting a raised portion is spaced from the adjacent face of said base, selected ones of said raised portions having pierced openings and such openings being aligned with individual ones of said base holes, the base holes aligned with said pierced openings extending through said base from one to the other of its faces to receive electrical component terminal leads, whereby desired electrical components comprising terminal leads are mounted on said base by extending the terminal leads thereof through selected ones of said base holes and the pierced openings aligned therewith and soldered thereat.

2. Apparatus as defined in claim 1 further including, a second conductor pattern of at least one conductor strip superimposed over the first conductor pattern, said second conductor pattern being secured adhesively to the common supporting base face of the said first conductor pattern except where portions of conductor strips of said second pattern crossover the paths of conductor strips of said first pattern, said crossover portion of said second pattern conforming to tthe cross-section of the underlying strip of said first pattern, and a separating insulator film between the contiguous strips.

3. Apparatus as defined in claim 1 further including, an overlayer of electrical insulating material covering said conductor strips and the face portions of said base between and along side of said conductor strips except that certain of said raised portions projecting through said overlayer so as to be exposed for soldering and otherwise for making electrical contact thereat.

4. Apparatus as defined in claim 1 wherein, selected ones of said conductor strips are made of resistive material to form a resistor conductive path.

5. Apparatus as defined in claim 1 wherein, selected ones of said conductor strips are mutually spaced and shaped to form a capacitor.

6. Apparatus as defined in claim 1 wherein, said circuit board including a switch contact formation comprising, a plurality of raised portions of selected ones of said strips wherein the last-mentioned raised portions define the individual switch contacts, said contacts being spaced along an arc with respect to a common axis perpendicular to said base, said base having one hole therein aligned with said axis, another of said strips having an extruded sleeve portion extending into said hole for journalling a rotatable switch shaft and making conductive contact with such shaft and which shaft has a conductive arm extending therefrom with a free end remote from said shaft arm for conductively connecting to individual ones of said contacts upon rotation of said shaft from one to another of its positions.

7. Apparatus as defined in claim 1 wherein, said circuit board including a switch contact formation comprising, a plurality of conductive contact slugs individually inserted into selected ones of said base holes and the raised portions aligned therewith, the ends of said slugs being soldered to the individual ones of said contiguous raised portions for defining terminal contacts for the conductor strips connected to said contiguous raised portions, the exposed ends of said contact slugs protruding upwardly from the base face opposite the base face containing said conductor strips, said contacting slugs also being spaced along an arc with respect to a common axis perpendicular to said base, another of said base holes being aligned with said axis, a conductive bushing seated in said another hole and having an end soldered to a raised portion aligned therewith, said bushing having an opening extending therein for journalling a rotatable switch shaft and also for making conductive contact therewith and which shaft has an arm extending along the base face containing the exposed ends of said slugs, and which arm has a free end extending remotely from said shaft for connecting with individual ones of said slugs upon rotation of said shaft from one to another of its positions.

8. Apparatus as defined in claim 1 wherein, one of said base holes being threaded, a standoff terminal post having a threaded shank secured to such threaded hole and having an inner end soldered to the raised portion aligned with such threaded hole, said standoff post having an exposed end projecting outwardly from the face of the base opposite the base face containing said strip conductors.

9. Apparatus as defined in claim 1 further including, a conductive socket member in one of said base holes having an end soldered to the raised portion aligned with such hole, said socket member having a socket bore at the face of said base opposite the base face containing said connectors, whereby said socket bore is adapted to receive terminal portions of electrical components.

10. Apparatus as defined in claim 1 further including, a second mechanically integrated circuit board mounted against said first mechanically integrated circuit board, with the plain side of said second circuit board being engaged in intimate contact with the circuit pattern side of said first circuit board, the engaging surface of said second circuit board being suitably recessed to clear the raised projections of the circuit pattern of said first circuit board, the resulting stack of two circuit boards having in pre-selected locations passages with inserted sleeves connecting aligned extruded raised portions of the two juxtaposed conductor patterns, said sleeves acting as capillary tubes for the purpose of drawing solder along leads of mounted electrical components inserted through said sleeves effecting an extended solder joint between the two juxtaposed circuit patterns thereat.

References Cited in the file of this patent

UNITED STATES PATENTS

| | | |
|---|---|---|
| 2,244,009 | Hiensch | June 3, 1941 |
| 2,270,166 | Hiensch | Jan. 13, 1942 |
| 2,512,162 | Lips | June 20, 1950 |
| 2,519,121 | Del Camp | Aug. 15, 1050 |
| 2,581,967 | Mitchell | Jan. 8, 1052 |
| 2,586,854 | Myers | Feb. 26, 1952 |
| 2,599,710 | Hathaway | June 10, 1952 |
| 2,633,526 | Snyder | Mar. 31, 1953 |
| 2,777,193 | Albright | Jan. 15, 1957 |
| 2,794,081 | Luhn | May 28, 1957 |